United States Patent
Peng et al.

(10) Patent No.: US 8,443,987 B2
(45) Date of Patent: May 21, 2013

(54) MOUNTING APPARATUS FOR ELECTRONIC DEVICE

(75) Inventors: Wen-Tang Peng, Taipei Hsien (TW); Wei Qiu, Shenzhen (CN); Bing-Bao Guo, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 329 days.

(21) Appl. No.: 12/774,740

(22) Filed: May 6, 2010

(65) Prior Publication Data

US 2011/0226710 A1   Sep. 22, 2011

(51) Int. Cl.
*A47F 7/00* (2006.01)

(52) U.S. Cl.
USPC ............................................. 211/26; 361/825

(58) Field of Classification Search
USPC ........ 211/26, 26.2, 183, 189, 190; 312/223.1, 312/223.2, 265.4; 361/825, 829, 679.33, 361/679.37, 679.31; 108/108, 109; 248/201
See application file for complete search history.

(56) References Cited

U.S. PATENT DOCUMENTS

| | | | | |
|---|---|---|---|---|
| 5,074,422 A | * | 12/1991 | Holtz | 211/187 |
| 5,734,557 A | * | 3/1998 | McAnally et al. | 361/727 |
| 5,921,644 A | * | 7/1999 | Brunel et al. | 312/223.2 |
| 6,019,446 A | * | 2/2000 | Laboch et al. | 312/265.1 |
| 6,269,959 B1 | * | 8/2001 | Haworth | 211/26 |
| 6,622,873 B2 | * | 9/2003 | Hegrenes et al. | 211/26 |
| 6,739,682 B2 | * | 5/2004 | Shih | 312/334.4 |
| 6,988,626 B2 | * | 1/2006 | Varghese et al. | 211/26 |
| 7,134,558 B1 | * | 11/2006 | Mimlitch et al. | 211/26 |
| 2011/0073726 A1 | * | 3/2011 | Bergesch | 248/201 |

FOREIGN PATENT DOCUMENTS

| | | |
|---|---|---|
| JP | 6260781 | 9/1994 |
| JP | 268478 | 9/1995 |
| JP | 61194897 | 8/1996 |
| JP | 2002278652 | 9/2002 |
| JP | 2006190772 | 7/2006 |

* cited by examiner

*Primary Examiner* — Korie H Chan
(74) *Attorney, Agent, or Firm* — Altis Law Group, Inc.

(57) ABSTRACT

A mounting apparatus includes a rack, two positioning members, two retaining members, and two latch members. The rack includes two first supports and two second supports. Each second support defines a plurality of locking holes. The positioning members are configured for attachment to an electronic device and engage with the first supports. The retaining members are configured for attachment to the electronic device and attached to the second supports. Each retaining member defines a through hole. Each latch member includes a first latch component and a second latch component. The first latch component includes two resiliently deformable securing pieces and defines a threaded hole. The securing pieces are received in one of the locking holes to secure the first latch components to the second supports. The second latch components pass through the through holes and are threaded in the threaded holes, to secure the retaining members to the second supports.

8 Claims, 7 Drawing Sheets

MOUNTING APPARATUS FOR ELECTRONIC DEVICE

BACKGROUND

1. Technical Field

The present disclosure relates to a mounting apparatus for an electronic device.

2. Description of Related Art

Servers are often mounted to a rack by sliders. This can increase manufacture costs of the system.

BRIEF DESCRIPTION OF THE DRAWINGS

Many aspects of the embodiments can be better understood with references to the following drawings. The components in the drawings are not necessarily drawn to scale, the emphasis instead placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
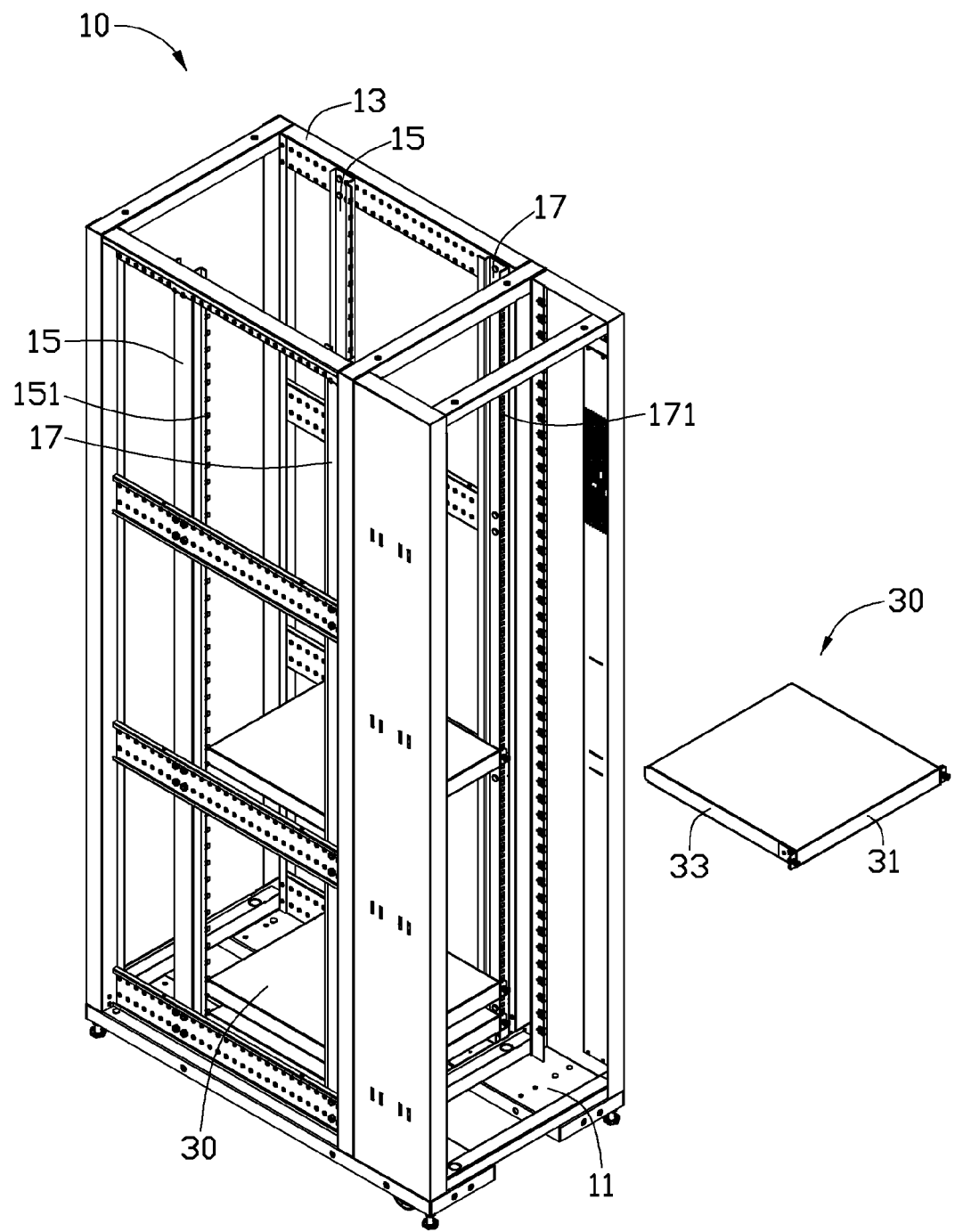
FIG. 1 is a partly exploded view of a mounting apparatus and an electronic device for an electronic device according to an embodiment.

Referring to FIG. 1, a mounting apparatus in accordance with an embodiment is configured for securing an electronic device 30. The mounting apparatus includes a rack 10, two retaining members 50, two positioning members 33, and two latch members 70. The electronic device 30 may be a server, for example.

Figure 7:
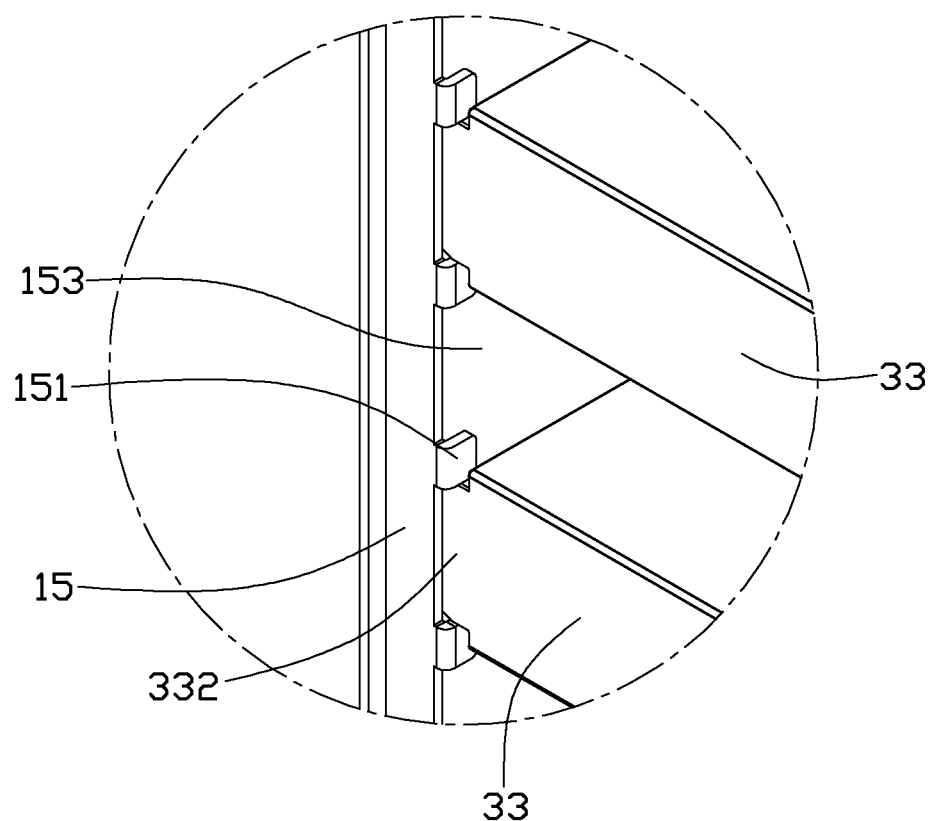
FIG. 7 is an enlarged view of portion VII of FIG. 5.

The rack 10 is capable of receiving a plurality of electronic devices 30 and includes a base 11, a top portion 13, a pair of first supports 15, and a pair of second supports 17. The first and second supports 15, 17 are fixed on the base 11 and the top portion 13. Referring to FIG. 7, a plurality of support tabs 151 is located on each first support 15, and a cutout 153 is defined between each two adjacent support tabs 151. A plurality of locking holes 171 is defined in each second supports 17. In an embodiment, a distance between each two adjacent support tabs 151 is equal, and a distance between each two adjacent locking holes 171 is also equal.

Figure 2:
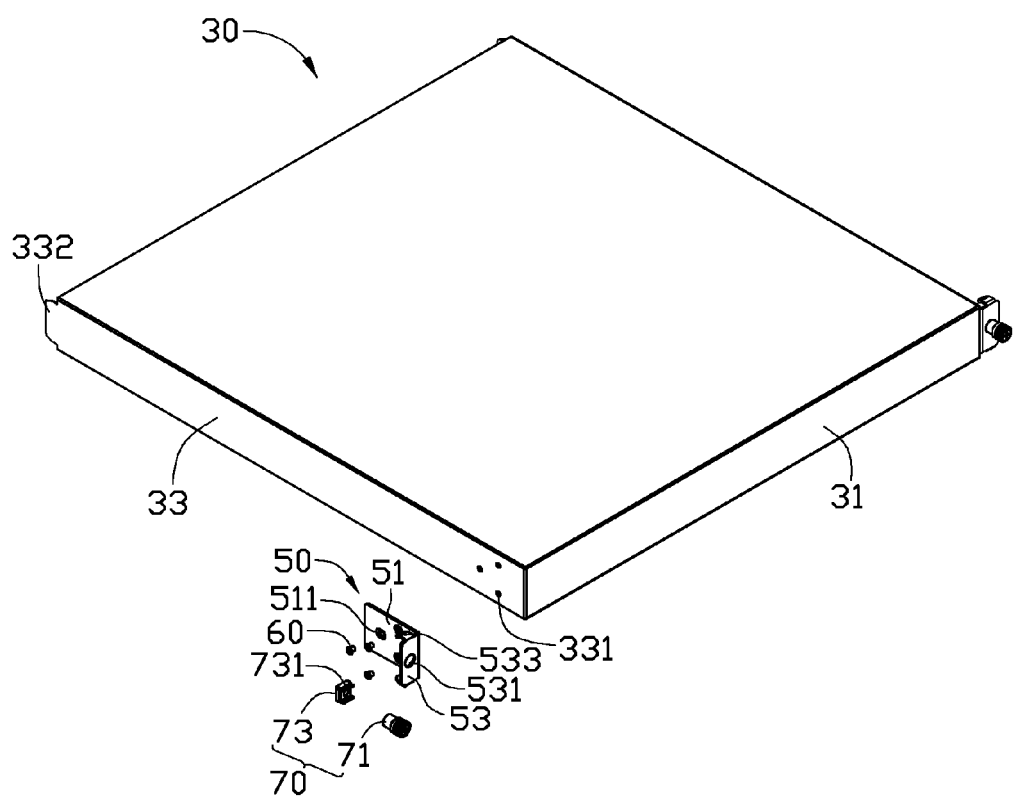
FIG. 2 is a partly exploded view of a retaining member and a latch member of the mounting apparatus of FIG. 1.

Referring to FIG. 2, each positioning member 33 is attached to each sidewall of the electronic device 30. A positioning portion 332 is disposed on an end of each positioning member 33 and is received in one cutout 153 of the first support 15. A plurality of fixing holes 331 is defined in an opposite end of the positioning member 33.

Each retaining member 50 is attachable to a positioning member 33 and includes a retaining portion 51 and a locking portion 53 located on the retaining portion 51. In one embodiment, the retaining portion 51 and the locking portion 53 are flat, and the retaining portion 51 is substantially perpendicular to the locking portion 53. The retaining portion 51 defines a plurality of retaining holes 511, corresponding to the fixing holes 331 of the positioning member 33. The locking portion 53 defines a through hole 531 and includes two resiliently deformable locking tabs 533 configured to be received in two locking holes 171 of the second support 17.

Figure 3:
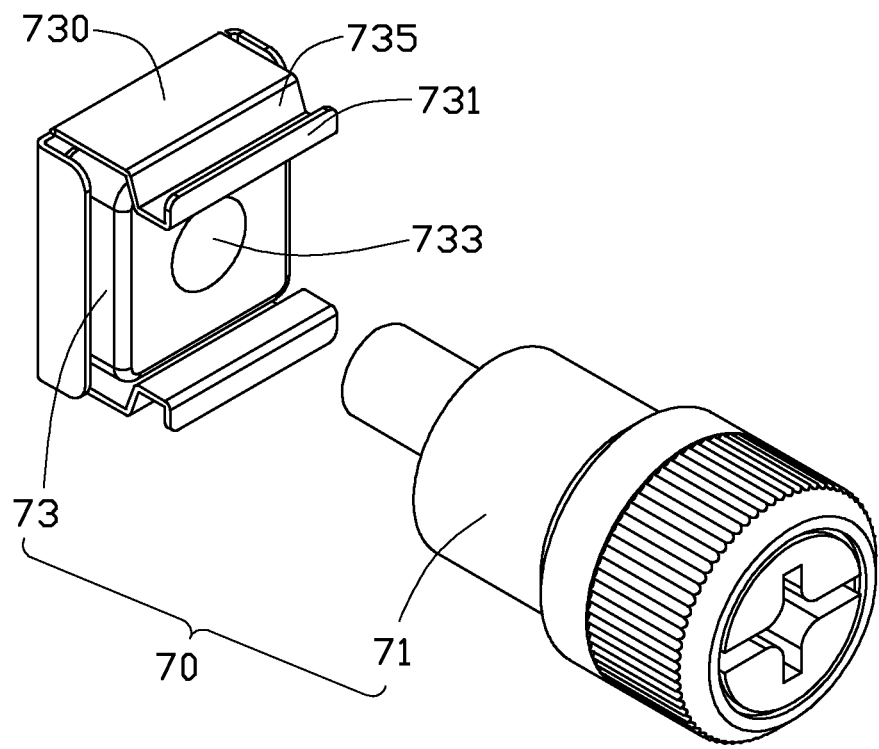
FIG. 3 is an exploded view of the latch member of FIG. 2.
Figure 4:
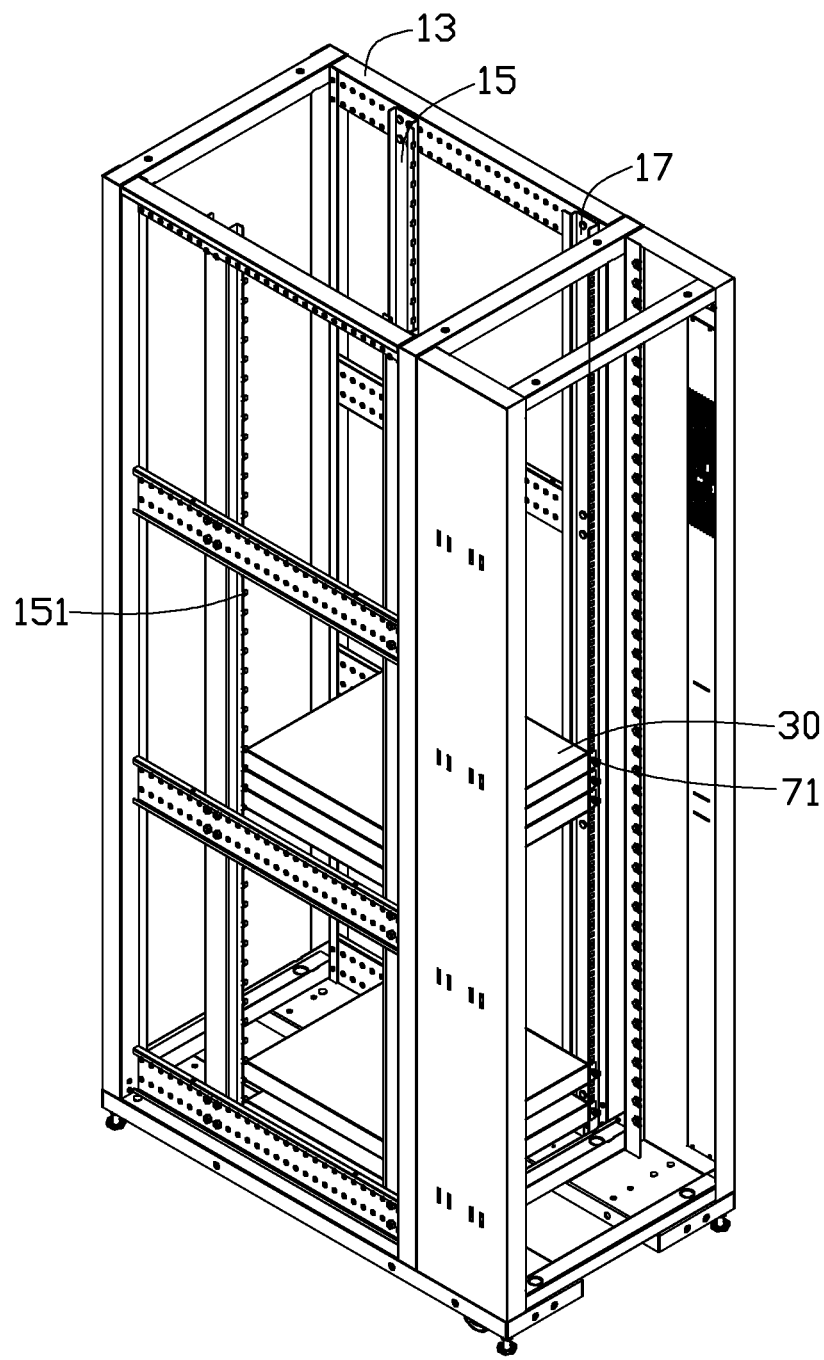
FIG. 4 is an assembled view of the mounting apparatus and disk drive of FIG. 1.
Figure 5:
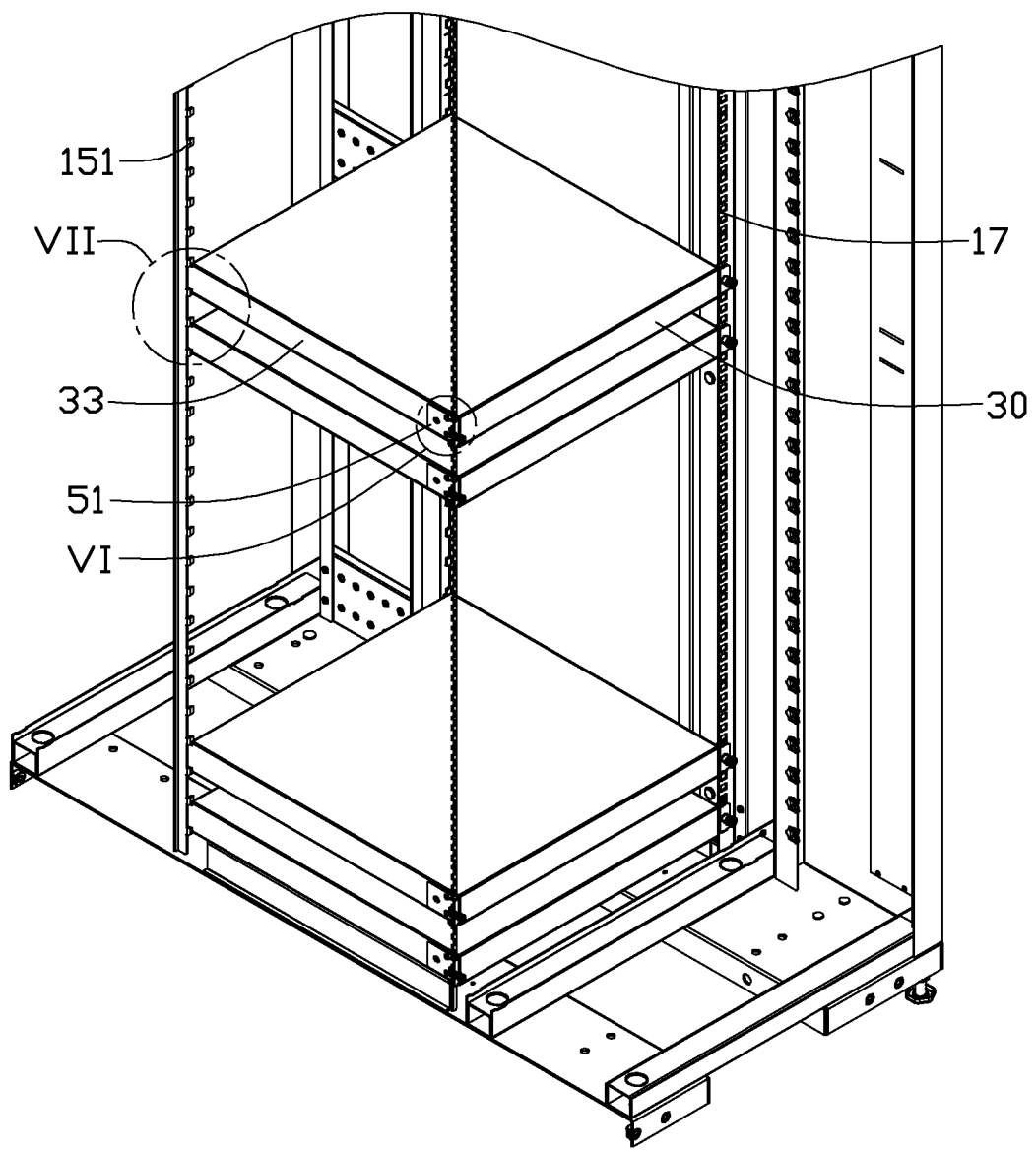
FIG. 5 is a cutaway view of FIG. 4.
Figure 6:
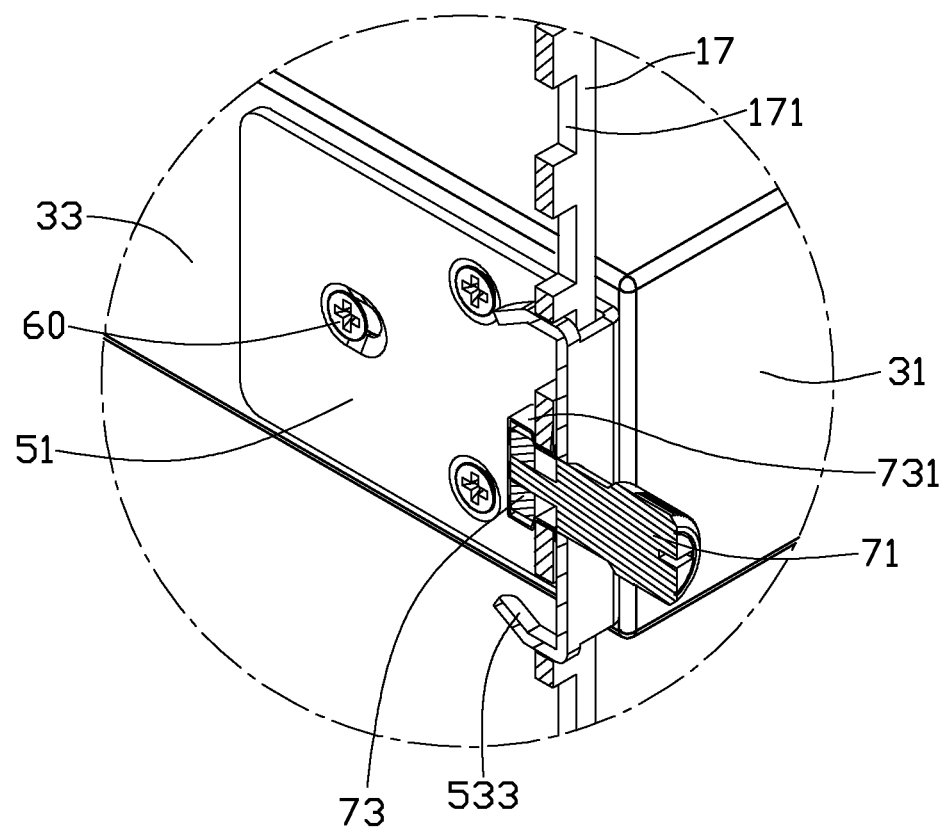
FIG. 6 is an enlarged view of portion VI of FIG. 5.

Referring to FIG. 3, each latch member 70 includes a second latch component 71 and a first latch component 73 capable of being fixed to the second latch component 71. The first latch component 73 defines a threaded hole 733 and includes two resiliently deformable securing pieces 730. A groove 735 is defined in each securing piece 730, and a locking flange 731 is located at one side of the groove 735.

Referring to FIGS. 4-7, in assembly, the retaining portions 51 of the retaining members 50 are attached to the positioning members 33, and the retaining holes 511 align with the fixing holes 331. A plurality of fasteners 60, such as screws, are received in the retaining holes 511 and the fixing holes 331, to fix the retaining members 50 on the positioning members 33.

The locking flanges 731 of two first latch components 73 pass through two locking holes 171 of the two second supports 17 due to resilient deformation of the securing pieces 730. Edges of the locking holes 171 are received in the grooves 735, and the locking flanges 731 abut the second supports 17.

The two retaining members 50 of the electronic device 30 are received in the rack 10. The positioning portions 332 of the positioning members 33 are received in the cutouts 153 of the first supports 15, and the two locking tabs 533 of each retaining member 50 are received in two locking holes 171 of each second support 17 positioned at two sides of one locking hole 171 receiving the first latch component 73. The threaded holes 733 of the first latch components 73 align with the through holes 531 of the retaining members 50. The locking portions 53 abut the second support 17. The second latch components 71 are received in the through holes 531 and the threaded holes 733, to secure the retaining members 50 on the second supports 17 and secure electronic device 30 to the rack 10.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for an electronic device, the mounting apparatus comprising:
   a rack comprising two first supports and two second supports, each second support defining a plurality of locking holes;
   two positioning members fixed to the electronic device, the two positioning members engage with the first supports;
   two retaining members fixed to the electronic device, the two retaining members attached to the second supports, each retaining member defines a through hole; and
   two latch members, each comprises a first latch component and a second latch component, each first latch component comprises two resiliently deformable securing pieces and define a threaded hole, the resiliently deformable securing pieces of each first latch component are received in one of the plurality of locking holes of each second support to secure the first latch components to the second supports, and the second latch components pass through the through holes and are threaded in the threaded holes to secure the two retaining members to the second supports;

wherein each retaining member comprises a retaining portion and a locking portion extending from the retaining portion; the retaining portions are fixed to the two positioning members; and the locking portions engage with the second supports; two locking tabs are located on the locking portion of each retaining member; the two locking tabs of each retaining member are received in two of the plurality of locking holes of each second support; and the one locking hole, that receives securing pieces of the first latch component, is located between the two of the plurality of locking holes.

2. A mounting apparatus comprising:

a rack receiving an electronic device and comprising two first supports and two second supports, each second support defines a plurality of locking holes, a plurality of support tabs located on each first support;

two retaining members fixed to the electronic device, a locking tab is located on each retaining member and is received in one of the plurality of locking holes of each second support, each retaining member defines a through hole;

two latch members, each latch member comprises a first latch component and a second latch component, each first latch component comprises resiliently deformable securing pieces, the resiliently deformable securing pieces of each first latch component are received in two of the plurality of locking holes, which are located on two sides of the one of the plurality of locking holes, to secure the first latch component to the second support, and the second latch components are received in the through holes to engage the latch members, to secure the two retaining members to the second supports; and two positioning members fixed to the electronic device, the plurality of support tabs of the first supports support the two positioning members.

3. The mounting apparatus of claim 2, wherein each retaining member comprises a retaining portion and a locking portion extending from the retaining portion; the retaining portions are fixed to the two positioning members; and the locking portions engage with the second supports.

4. The mounting apparatus of claim 3, wherein the locking tab of each retaining member is located on the locking portion of each retaining member.

5. The mounting apparatus of claim 3, wherein the locking portion of each retaining member is substantially perpendicular to the retaining portion.

6. The mounting apparatus of claim 2, wherein each securing piece of the first latch component defines a groove that receives an edge of the corresponding locking hole of the second support.

7. The mounting apparatus of claim 2, wherein a locking flange, located on each securing piece, passes through the corresponding locking hole of the second support due to resilient deformation of the securing piece and abuts the second support, to retain the first latch component on the second support.

8. The mounting apparatus of claim 2, wherein each first support defines a plurality of cutouts, each between two adjacent support tabs; and a positioning portion is disposed on each positioning member and is received in one cutout of each first support.

* * * * *